United States Patent

Kenney

[11] Patent Number: 5,849,077
[45] Date of Patent: Dec. 15, 1998

[54] PROCESS FOR GROWING EPITAXIAL SILICON IN THE WINDOWS OF AN OXIDE-PATTERNED WAFER

[75] Inventor: Danny J. Kenney, Sherman, Tex.

[73] Assignee: Texas Instruments Incorporated, Dallas, Tex.

[21] Appl. No.: 665,186

[22] Filed: Jun. 14, 1996

Related U.S. Application Data

[63] Continuation of Ser. No. 226,157, Apr. 11, 1994, abandoned.

[51] Int. Cl.$^6$ .................................................. C30B 25/04
[52] U.S. Cl. ............................... 117/90; 117/101; 117/95; 117/923; 117/935
[58] Field of Search ............................ 117/95, 101, 923, 117/935, 90

[56] References Cited

U.S. PATENT DOCUMENTS

| | | | |
|---|---|---|---|
| 4,547,231 | 10/1985 | Hine | 117/923 |
| 4,637,127 | 1/1987 | Kurogi et al. | 117/923 |
| 4,749,441 | 6/1988 | Christenson et al. | 117/923 |
| 4,829,016 | 5/1989 | Neudeck | 437/31 |
| 5,269,876 | 12/1993 | Mizutani | 117/923 |
| 5,278,092 | 1/1994 | Sato | 117/923 |
| 5,432,120 | 7/1995 | Meister et al. | 117/923 |

FOREIGN PATENT DOCUMENTS

| | | | |
|---|---|---|---|
| 57-155764 | 9/1982 | Japan | 117/923 |
| 59-83998 | 5/1984 | Japan | 117/923 |
| 963799 | 7/1964 | United Kingdom | 117/923 |

OTHER PUBLICATIONS

"Bipolar Transistor Structures Using Silicon Selective and Epitaxial Lateral Overgrowth Technology", Prof. G. W. Neudeck.

*Primary Examiner*—Robert Kunemund
*Attorney, Agent, or Firm*—Lawrence J. Bassuk; Richard L. Donaldson

[57] ABSTRACT

A method of growing epitaxial regions comprising the steps of providing a silicon substrate, forming a patterned oxide layer having a planar upper surface on the substrate, the oxide layer having an aperture therein extending to the substrate, forming a layer of silicon in the aperture extending above the surface of the oxide layer and removing the portion of the layer of silicon extending above the surface of the oxide layer. The sidewalls of the oxide layer defining the aperture are outwardly sloped in the direction of the upper surface. The layer of silicon is formed by a procedure which forms crystalline silicon in the aperture and forms no silicon over the oxide layer. The portion of the layer of silicon extending above the surface of the oxide layer is removed by a chemical-mechanical polishing operation. In addition, to provide auto-alignment, the layer of oxide is selectively etched relative to the layer of silicon to provide a step at the interface of the layer of oxide and the layer of silicon. Then an oxide layer is formed over the layer of oxide and the layer of silicon.

16 Claims, 3 Drawing Sheets

PROCESS FOR GROWING EPITAXIAL SILICON IN THE WINDOWS OF AN OXIDE-PATTERNED WAFER

This application is a Continuation, of application Ser. No. 08/226,157, filed Apr. 11, 1994 now abandoned.

BACKGROUND OF THE INVENTION

1. Field of the Invention

This invention relates to selective epitaxial growth on (100) wafers using chemical-mechanical polishing for post-epitaxial planarization to construct oxide isolated semiconductor devices.

2. Brief Description of the Prior Art

Selective epitaxial growth (SEG) is the deposition of an epitaxial layer within the windows of an oxide-patterned wafer. The current problem with SEG is the faceting or bumps that form along certain crystal planes at the boundaries of the epitaxial tank. This faceting results in a topology which eliminates the possibility of SEG being incorporated into a production process flow due to problems with metallization coverage.

The thickness uniformity of an epitaxial layer using a barrel-style susceptor in a chemical vapor deposition (CVD) reactor is currently controlled by making adjustments to the source gas flows and inject nozzle positioning. Control by this means is limited to about 5–6% uniformity and frequent processing parameter adjustments are therefore necessary.

Current isolation oxidation techniques involve localized oxidation of silicon (LOCOS) to grow the thick field oxide. This involves three-step single wafer plasma etching and high pressure oxidation, resulting in non-planar oxide growth known as bird's beak or bird's head. This is a complicated process which results in metalization coverage issues and reliability concerns.

Prior art attempts to alleviate the problems caused by SEG faceting have included a 45 degree rotation of the oxide pattern toward the <110> direction of the crystal lattice orientation using (100) material. Rotation relocates the faceting from the relatively lengthy edges of the epitaxial geometries to the corners. The facets then appear as dips in the epitaxial layer at the corners of the tanks. Although the surface may be level with the field oxide, the corner facets still provide metal coverage problems as well as non-uniformity in implant and diffusion penetration.

Prior art measures aimed at increasing the uniformity and control of epitaxial layers have included reaction chamber modifications, various susceptor designs and compositions and horizontal, single-wafer processing, all of which attempt to control the thickness within the chemical vapor deposition (CVD).

In addition, prior art auto-alignment techniques involve an optical signal positioned perpendicular to the wafer surface. Optical sensors are located in close proximity to the signal source. When scanning a level topography, the signal is reflected from the surface of the wafer directly back into the optical source and the optical sensors detect no signal. When a non-level feature is encountered, the reflection of the incident beam is diffracted and detected as a positive signal by the optical sensors. In order to align one masking level to the previous masking levels, alignment marks are constructed which consist of a series of intentionally formed indentations. The auto-alignment signal scans the surface of the wafer, searching for the series of marks, each of which is recognized as a step down followed by a step up. Electronic positioning then aligns the marks on the current photomask to the marks constructed during the previous masking step.

The method of selectively grown epitaxy followed by the chemical-mechanical planarization of the epitaxial faceting in accordance with the present invention results in a completely planar surface. The scanning of the optical signal during the subsequent masking level is unable to recognize the auto-alignment marks due to the absence of the series of steps. Auto-alignment of a completely planar surface using the optical system described above is not possible.

SUMMARY OF THE INVENTION

In accordance with the present invention, faceting that is associated with selectively deposited epitaxy is eliminated by the use of chemical-mechanical planarization. Planarization of SEG material provides a completely planar surface, the absence of which has kept SEG from being considered in a production facility in the past. Also, high selectivity of silicon-to-oxide polish results in an active epitaxial thickness that is determined by the oxide thickness, which can be very tightly controlled in a thermal oxidation. Implementation of planarized SEG greatly simplifies process flows of oxide isolated technologies without a concern for topographical issues.

Briefly, the selective epitaxial growth (SEG) process flow in accordance with the present invention starts with a silicon substrate, preferably (100). While other orientation can be used, such as (111) or (110), (100) is preferred and greatly dominates the market. An oxide layer is formed over the substrate and is then patterned and etched in standard manner to provide a diffusion under film (DUF) mask region in the substrate. A DUF region is then implanted into the unmasked region of the substrate and the substrate is then annealed, at which time a thin oxide layer is formed over the DUF region. The DUF region is a region in the substrate which has been more heavily doped than the substrate to provide a low resistance path in the substrate. The remaining oxide region is then patterned and etched in standard manner to provide an exposed channel stop region and dopant ions are then implanted into the exposed channel stop region of the substrate to provide a channel stop surrounding the DUF region. The channel-stop region is a highly doped P region which ensures isolation between epitaxial tanks by doping a "moat" below the isolation oxidation. The oxide regions are then removed in standard manner, preferably by using a piranha stripping solution (HF and HCl), to expose the DUF region and the channel stop region. A second planar oxide layer of controlled thickness is now formed over the substrate, channel stop region and DUF region, preferably by chemical vapor deposition. The thickness of the oxide layer can be controlled to within 20 to 30 angstroms. The second oxide layer is patterned and etched using an isotropic HF etchant to expose the DUF region and provide sidewalls on the second oxide layer over the DUF region that slope away from the DUF region. A silicon epitaxial layer is then formed only over the exposed DUF region by selective epitaxial growth over the DUF region and along the sloping sidewalls of the second oxide layer, the epitaxial layer extending above the top surface of the second oxide layer. The epitaxial layer is formed selectively only over the DUF layer by flowing dichlorosilane and hydrogen chloride in a hydrogen ambient over the DUF layer in an epitaxial reactor as is well known, the hydrogen chloride preventing silicon growth over the oxide regions but not over the silicon regions. The epitaxial layer is then planarized with the oxide layer by a chemical-mechanical polishing operation, preferably using a Westec polisher with a standard polishing slurry for silicon removal, to provide a planar surface containing the epitaxially grown silicon region surrounded by the second oxide layer. Other possible polish equipment would include, for example, standard batch wafer polishers. The front side of the wafer is placed in contact with a standard rotating polish pad. A certain amount of downward force is applied to mechanically assist in frontside silicon removal. Also, a slurry solution is continually introduced to the polish pad and wafer to provide chemical removal of the silicon. The thickness and planarity of the epitaxially grown silicon layer is assured and known since it can be determined when the polisher has polished the surface of the epitaxially grown layer back as far as the second oxide layer, the thickness of the latter being accurately known and being the same as the second oxide layer. The epitaxial region is now available for further processing in standard manner to form semiconductor devices and passive elements therein and thereon in standard manner.

Chemical-mechanical planarization involves overgrowth of the SEG such that the entire oxide window is filled with epitaxially deposited silicon with the faceting being completely above the surface of the oxide. The epitaxial overgrowth is then polished level with the surface of the oxide, providing a planar surface with no evidence of faceting. Chemical-mechanical planarization only requires that the epitaxial layer be grown sufficiently thick to fill the oxide window. The active epitaxial layer thickness is determined during the planarization process in which the highly uniform oxide layer is the controlling factor.

Various iterations of LOCOS techniques have been attempted in order to simplify process flow. Chemical-mechanical planarization somewhat reduces the effects of the bird's beak or bird's head topography. The process flow utilizing the chemical-mechanical planarization of SEG eliminates single wafer, high-cost, complicated plasma processing with a batch process involving a wet etch dip. LOCOS and the accompanying bird's head formation is completely eliminated. The SEG polish results in an absolutely planar surface which cannot be obtained with current attempts at bird's head planarization.

As a solution to the alignment problem as discussed above, a post-planarization hydrofluoric acid dip is implemented, the benefits of which are two-fold. First, the HF, which attacks oxide, reduces the thickness of the field oxide and leaves the thickness of the epitaxial islands unchanged. The result is a step difference between the surface of the oxide and the surface of the epitaxial tank. This step difference, when used for alignment marks, results in the diffraction of the reflected optical signal and detection by the nearby optical sensors. This allows the base mask to be auto-aligned to the epitaxial pattern. The second benefit of the post-planarization HF dip is the partial exposure of the epitaxial sidewall. Previous work has determined that polysilicon, defective crystalline silicon or a combination of the two (referred to hereinafter as "polysilicon") forms at the sidewall interface between the epitaxial tank and the field oxide. This polysilicon formation is a leakage path for electric current which results in low junction breakdowns during device testing. By decreasing the thickness of the surrounding field oxide during the HF dip, the polysilicon deposit on the epitaxial tank sidewalls is exposed. Although only the uppermost portion of the epitaxial tank sidewall is exposed, this is the region in which the polysilicon formation is greatest. The thermal oxidation which follows the post-planarization HF dip then consumes the polysilicon, resulting in a non-leaky epitaxial/oxide junction.

DESCRIPTION OF THE PREFERRED EMBODIMENTS

Figure 1A:
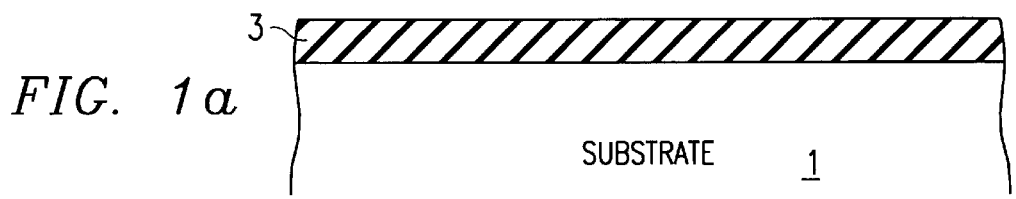
FIGS. 1a to 1j are a process flow for forming an epitaxially grown surface for further processing in accordance with the present invention.
Figure 1B:
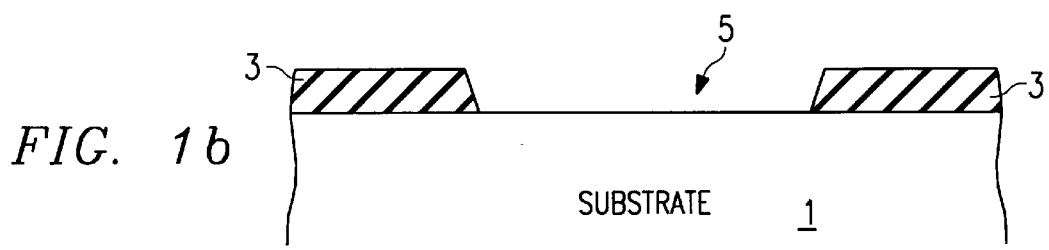
Figure 1C:
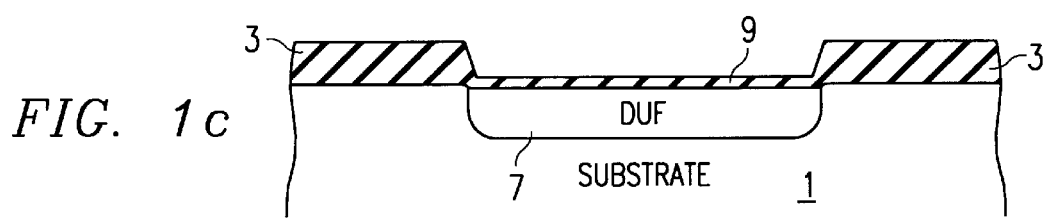
Figure 1D:
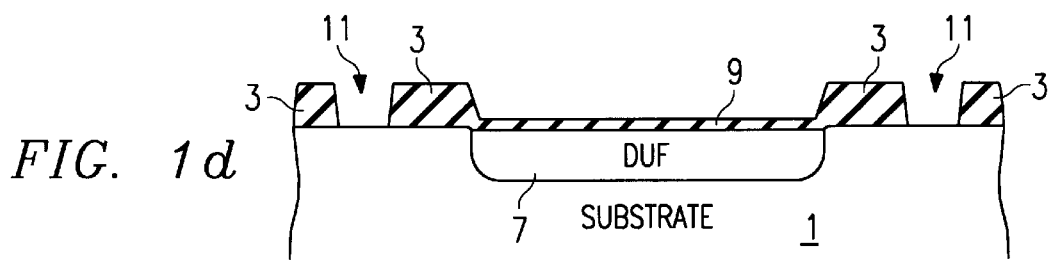
Figure 1E:
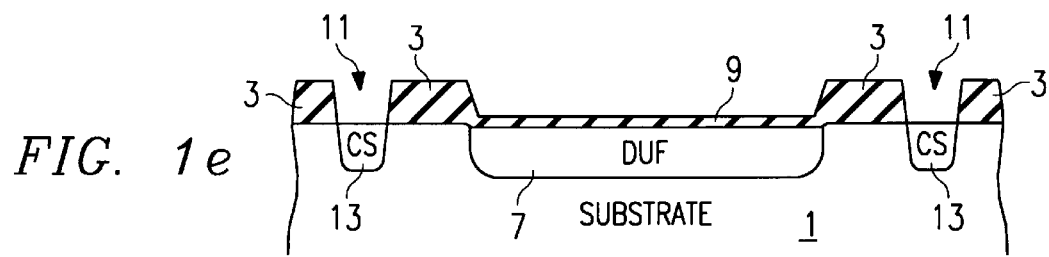
Figure 1F:
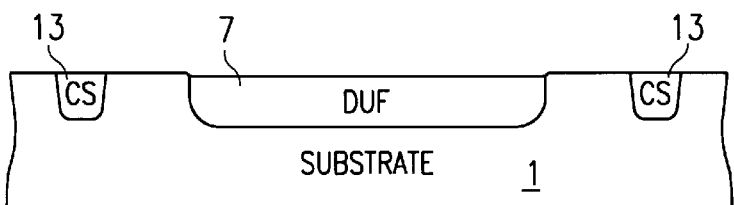
Figure 1G:
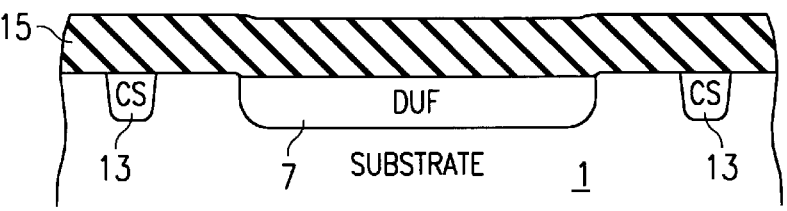
Figure 1H:
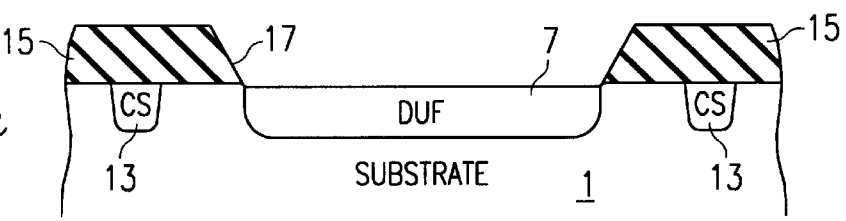
Figure 1I:
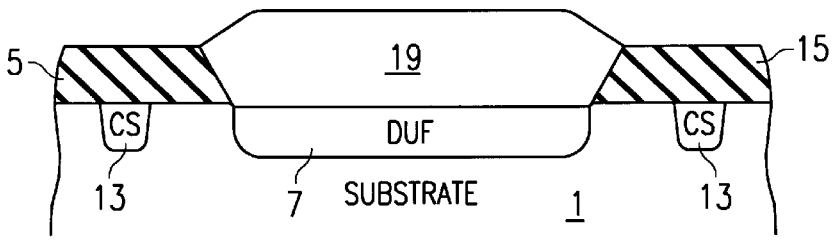
Figure 1J:
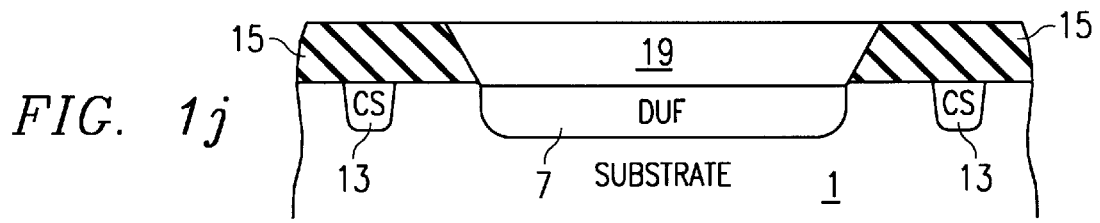

The selective epitaxial growth (SEG) process flow in accordance with the present invention is as follows with reference to the drawings. There is initially provided a (100) silicon substrate 1 on which an oxide layer 3 is formed in standard manner, such as by thermal oxidation of the silicon substrate as shown in FIG. 1a. The oxide layer 3 is then patterned and etched in standard manner to provide a diffusion under film (DUF) mask region 5 as shown in FIG. 1b. A DUF region 7 is then implanted into the unmasked region of the substrate 1 and the substrate is then annealed to form a thin oxide layer 9 over the DUF region as shown in FIG. 1c. The remaining oxide region 3 is then patterned and etched in standard manner as shown in FIG. 1d to provide an exposed channel stop region 11 and dopant ions 13 are then implanted into the exposed channel stop region of the substrate 1 to provide a channel stop surrounding the DUF region 7 as shown in FIG. 1e. The oxide regions 3 and 9 are then removed in standard manner, preferably by using a hydrofluoric acid stripping solution, exposing the DUF region 7 and the channel stop region 13 as shown in FIG. 1f. A second planar oxide layer 15 is now formed over the substrate 1, channel stop region 13 and DUF region 7, preferably by chemical vapor deposition as shown in FIG. 1g. The oxide layer 15 is patterned and etched using a buffered HF etchant to expose the DUF region 7 and provide sidewalls 17 on the oxide layer 15 that slope away from the DUF region as shown in FIG. 1h when an isotropic etchant is used. The sidewalls 17 would be substantially vertical if an anisotropic etchant were used instead. A silicon epitaxial layer 19 is then formed by selective epitaxial growth over the DUF region 7 and along the sidewalls 17 of the oxide layer 15, the epitaxial layer 19 extending above the top surface of the oxide layer 15 as shown in FIG. 1i. The epitaxial layer 19 is formed by flowing dichlorosilane and hydrogen chloride in a hydrogen ambient, the hydrogen chloride preventing silicon growth over the oxide regions. The epitaxial layer 19 is then planarized with the oxide layer 15 by a chemical-mechanical operation using a commercially available Westech polisher with standard polish slurry for silicon removal. This was accomplished by placing the front side of the wafer in contact with a standard rotating polish pad. A certain amount of downward force was applied to mechanically assist in frontside silicon removal. Also, a slurry solution was continually introduced to the polish pad and wafer to provide chemical removal of the silicon to provide a planar surface containing the epitaxial region 19 surrounded by the oxide region 15 as shown in FIG. 1j. The epitaxial region 19 is now available for further processing in standard manner to form semiconductor devices and passive elements therein and thereon in standard manner.

As is apparent, the above described fabrication process provides the ability to planarize the faceting associated with SEG which allows devices to be oxide isolated without the need for LOCOS. By removing LOCOS and the formation of bird's head and bird's beak, complete planarization is achieved and lateral encroachment due to bird's beak does not occur. Concern for metalization coverage and reliability due to device topography is no longer an issue and the absence of lateral encroachment allows for smaller design of devices.

Control of the active epitaxial layer thickness is no longer required during the actual chemical vapor deposition but would take place during the subsequent polish. The field oxide, which is highly uniform in a thermal oxidation, serves as the endpoint of the SEG planarization. The final thickness of the active epitaxial area is therefore controlled by the surrounding field oxide.

Aside from the elimination of the LOCOS process currently being used to isolate devices, several other process steps are also eliminated or simplified. The protective nitride deposition and associated nitride removal steps of the prior art are no longer required as are not the intermediate oxide layer of the prior art. The complicated single-wafer plasma etching of the nitride, oxide and silicon prior to LOCOS is replaced with a batch dip in a common oxide etch to define the epitaxial windows. With the elimination of these steps is a decrease in product cycle time as well as the increase in associated machine availability and/or expensive cleanroom floor space.

Figure 1K:
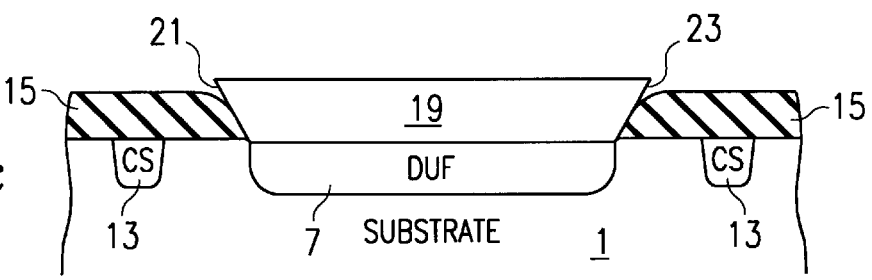
FIGS. 1k to 1m are a process flow for auto-alignment.
Figure 1L:
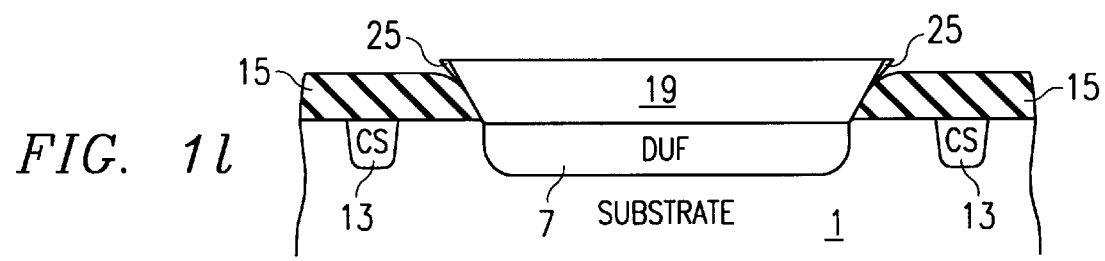
Figure 1M:
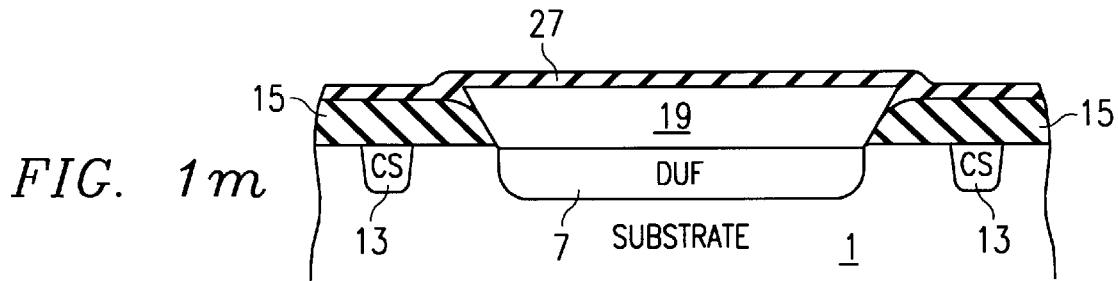

To provide a solution to the alignment problem as discussed above, and with reference to FIG. 1k, a post-planarization hydrofluoric acid (HF) dip is implemented on the structure of FIG. 1j. The HF, which attacks oxide, reduces the thickness of the field oxide 15 and leaves the thickness of the epitaxial islands 19 unchanged. The result is a step difference 21 between the surface of the oxide 15 and the surface of the epitaxial tank 19. This step difference 21, when used for alignment marks, results in the diffraction of the reflected optical signal and detection by the nearby optical sensors. This allows subsequent masking levels to be auto-aligned to the epitaxial pattern. Also, the post-planarization HF dip provides a partial exposure of the epitaxial sidewall 23. Polysilicon 25 forms at the sidewall interface between the epitaxial tank 19 and the field oxide 15 as shown in FIG. 1l. This polysilicon formation is a leakage path for electric current which results in low junction breakdowns during device testing and operation. By decreasing the thickness of the surrounding field oxide 15 during the HF dip, the polysilicon deposit 25 on the epitaxial tank sidewalls is exposed. Although only the uppermost portion of the epitaxial tank sidewall is exposed, this is the region in which the polysilicon formation is greatest. The thermal oxidation 27 which follows the post-planarization HF dip then consumes the polysilicon, resulting in a non-leaky epitaxial/oxide junction as shown in FIG. 1m.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A method for establishing epitaxial regions comprising the steps of:
    (a) providing a substrate,
    (b) establishing an oxide layer being patterned, having a substantially planar upper surface on the substrate, and having an aperture therein extending to the substrate,
    (c) forming a silicon epitaxial layer in the aperture extending above the surface of the oxide layer;
    (d) removing the portion of the silicon epitaxial layer extending above the surface of the oxide layer;
    (e) selectively etching the layer of oxide relative to the silicon epitaxial layer to provide a step at the interface of the layer of oxide and the silicon epitaxial layer; and
    (f) forming a blanket oxide layer over the layer of oxide and the silicon epitaxial layer.

2. The method of claim 1 in which the selective etching of the layer of oxide relative to the silicon epitaxial layer partially exposes polysilicon material formed between the silicon epitaxial layer and the layer of oxide.

3. The method of claim 1 in which the forming of the blanket oxide layer consumes polysilicon material formed between the silicon epitaxial layer and the layer of oxide.

4. The method of claim 2 in which the forming of the blanket oxide layer consumes the polysilicon material formed between the silicon epitaxial layer and the layer of oxide.

5. The method of claim 1 in which the silicon epitaxial layer is formed by a procedure that forms crystalline silicon in the aperture and forms no silicon over the oxide layer.

6. The method of claim 2 in which the silicon epitaxial layer is formed by a procedure that forms crystalline silicon in the aperture and forms no silicon over the oxide layer.

7. The method of claim 3 in which the silicon epitaxial layer is formed by a procedure that forms crystalline silicon in the aperture and forms no silicon over the oxide layer.

8. The method of claim 4 in which the silicon epitaxial layer is formed by a procedure that forms crystalline silicon in the aperture and forms no silicon over the oxide layer.

9. The method of claim 1 further comprising reflecting an optical signal from the step provided at the interface of the layer of oxide and the silicon epitaxial layer to an optical signal receiver.

10. The method of claim 2 further comprising reflecting an optical signal from the step provided at the interface of the layer of oxide and the silicon epitaxial layer to an optical signal receiver.

11. The method of claim 3 further comprising reflecting an optical signal from the step provided at the interface of the layer of oxide and the silicon epitaxial layer to an optical signal receiver.

12. The method of claim 4 further comprising reflecting an optical signal from the step provided at the interface of the layer of oxide and the silicon epitaxial layer to an optical signal receiver.

13. The method of claim 5 further comprising reflecting an optical signal from the step provided at the interface of the layer of oxide and the silicon epitaxial layer to an optical signal receivers.

14. The method of claim 6 further comprising reflecting an optical signal from the step provided at the interface of the layer of oxide and the silicon epitaxial layer to an optical signal receiver.

15. The method of claim 7 further comprising reflecting an optical signal from the step provided at the interface of the layer of oxide and the silicon epitaxial layer to an optical signal receiver.

16. The method of claim 8 further comprising reflecting an optical signal from the step provided at the interface of the layer of oxide and the silicon epitaxial layer to an optical signal receiver.

* * * * *